(12) United States Patent
Li et al.

(10) Patent No.: US 11,209,702 B2
(45) Date of Patent: Dec. 28, 2021

(54) ARRAY SUBSTRATE, DISPLAY PANEL AND DISPLAY DEVICE

(71) Applicant: BOE TECHNOLOGY GROUP CO., LTD., Beijing (CN)

(72) Inventors: Wenbo Li, Beijing (CN); Xinyin Wu, Beijing (CN); Pan Li, Beijing (CN); Hongfei Cheng, Beijing (CN); Jianbo Xian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 170 days.

(21) Appl. No.: 16/184,305

(22) Filed: Nov. 8, 2018

(65) Prior Publication Data

US 2019/0072825 A1 Mar. 7, 2019

Related U.S. Application Data

(62) Division of application No. 14/785,831, filed as application No. PCT/CN2015/080456 on Jun. 1, 2015, now Pat. No. 10,274,790.

(30) Foreign Application Priority Data

Oct. 27, 2014 (CN) .......................... 201420627934.3

(51) Int. Cl.
*G02F 1/1343* (2006.01)
*G02F 1/1362* (2006.01)
(Continued)

(52) U.S. Cl.
CPC ...... *G02F 1/134309* (2013.01); *G02F 1/1368* (2013.01); *G02F 1/13439* (2013.01);
(Continued)

(58) Field of Classification Search
None
See application file for complete search history.

(56) References Cited

U.S. PATENT DOCUMENTS

| | | | |
|---|---|---|---|
| 2006/0103800 A1 | 5/2006 | Li et al. | |
| 2007/0023760 A1* | 2/2007 | Kim | .................. H01L 29/78669 |
| | | | 257/72 |

(Continued)

FOREIGN PATENT DOCUMENTS

| | | |
|---|---|---|
| CN | 2852196 Y | 12/2006 |
| CN | 101568877 A | 10/2009 |

(Continued)

OTHER PUBLICATIONS

Supplementary European Search Report and Written Opinion received for EP Patent Application No. 15778186.5, dated Apr. 24, 2018, 10 pages.

(Continued)

*Primary Examiner* — Edward J Glick
*Assistant Examiner* — Anthony G Quash
(74) *Attorney, Agent, or Firm* — Womble Bond Dickinson (US) LLP (57) ABSTRACT

The present application discloses an array substrate, a display panel and a display device. The array substrate comprises: a plurality of data lines and a plurality of gate lines, a plurality of pixel units defined by the plurality of data lines and the plurality of gate lines, each pixel unit comprising a first pixel electrode, a second pixel electrode, and at least three thin film transistors, the pixel unit further comprising: a charge-discharge element, the charge-discharge element and a third thin film transistor in the at least three thin film transistors charging and discharging the pixel unit such that the pixel unit forms a first voltage region and a second voltage region with different voltages.

8 Claims, 5 Drawing Sheets

(51) Int. Cl.

| | | |
|---|---|---|
| *G02F 1/1368* | (2006.01) | |
| *H01L 21/02* | (2006.01) | |
| *H01L 21/443* | (2006.01) | |
| *H01L 27/02* | (2006.01) | |
| *H01L 27/06* | (2006.01) | |
| *H01L 27/12* | (2006.01) | |
| *H01L 29/49* | (2006.01) | |
| *H01L 29/51* | (2006.01) | |
| *H01L 29/66* | (2006.01) | |
| *H01L 21/285* | (2006.01) | |
| *H01L 29/786* | (2006.01) | |

(52) U.S. Cl.
CPC .... *G02F 1/13624* (2013.01); *G02F 1/136227* (2013.01); *G02F 1/136286* (2013.01); *H01L 21/0217* (2013.01); *H01L 21/0262* (2013.01); *H01L 21/02274* (2013.01); *H01L 21/02532* (2013.01); *H01L 21/02565* (2013.01); *H01L 21/02592* (2013.01); *H01L 21/02631* (2013.01); *H01L 21/2855* (2013.01); *H01L 21/443* (2013.01); *H01L 27/0207* (2013.01); *H01L 27/0629* (2013.01); *H01L 27/124* (2013.01); *H01L 27/1222* (2013.01); *H01L 27/1225* (2013.01); *H01L 27/1251* (2013.01); *H01L 27/1255* (2013.01); *H01L 27/1259* (2013.01); *H01L 29/495* (2013.01); *H01L 29/4908* (2013.01); *H01L 29/518* (2013.01); *H01L 29/66969* (2013.01); *G02F 1/134345* (2021.01); *G02F 1/136213* (2013.01); *G09G 2300/043* (2013.01); *G09G 2300/0426* (2013.01); *G09G 2300/0447* (2013.01); *G09G 2320/028* (2013.01); *H01L 29/66765* (2013.01); *H01L 29/7869* (2013.01); *H01L 29/78669* (2013.01)

(56) References Cited

U.S. PATENT DOCUMENTS

| | | | | |
|---|---|---|---|---|
| 2008/0136985 A1* | 6/2008 | Hsieh | ............... | G09G 3/3648 349/39 |
| 2008/0143912 A1* | 6/2008 | Kim | ............... | H01L 27/1255 349/48 |
| 2008/0297676 A1* | 12/2008 | Kimura | ............... | H01L 29/7869 349/39 |
| 2009/0021683 A1* | 1/2009 | Lee | ............... | G02F 1/134363 349/141 |
| 2009/0268112 A1 | 10/2009 | Lu et al. | | |
| 2011/0032457 A1* | 2/2011 | Kwak | ............... | G02B 5/223 349/106 |
| 2011/0205461 A1 | 8/2011 | Chen et al. | | |
| 2011/0267554 A1* | 11/2011 | Yang | ............... | G09G 3/3659 349/41 |
| 2012/0033140 A1 | 2/2012 | Yanbing | | |
| 2012/0033148 A1* | 2/2012 | Yang | ............... | G02F 1/13624 349/39 |
| 2013/0083263 A1* | 4/2013 | Kim | ............... | G02F 1/13624 349/38 |
| 2014/0211135 A1* | 7/2014 | Jung | ............... | G02F 1/136204 349/106 |
| 2015/0243238 A1* | 8/2015 | Jung | ............... | G09G 3/3648 345/103 |
| 2016/0109774 A1* | 4/2016 | Jung | ............... | G02F 1/133707 349/46 |

FOREIGN PATENT DOCUMENTS

| | | |
|---|---|---|
| CN | 103076702 A | 5/2013 |
| CN | 103323990 A | 9/2013 |
| CN | 204065626 U | 12/2014 |
| JP | 08-298638 A | 11/1996 |

OTHER PUBLICATIONS

Kim, S., et al., "Development of a resistivity division driving method for the vertically placed RGB pixels of the eight-domain thin-film-transistors liquid crystal display," Journal of Information Display, vol. 14, No. 3, pp. 93-96 (Sep. 1, 2013).

International Search Report and Written Opinion received for PCT Patent Application No. PCT/CN2015/080456, dated Aug. 28, 2015, 16 pages (8 pages of English Translation and 8 pages of Original Document).

International Preliminary Reporton Patentability received for PCT Patent Application No. PCT/CN2015/080456, dated May 11, 2017, 13 pages (8 pages of English Translation and 5 pages of Original Document).

\* cited by examiner

ARRAY SUBSTRATE, DISPLAY PANEL AND DISPLAY DEVICE

The present application is the U.S. national phase entry of PCT/CN2015/080456, with an international filing date of Jun. 1, 2015, which claims the benefit of Chinese Patent Application No. 201420627934.3, filed on Oct. 27, 2014, the entire disclosure of which is incorporated herein by reference.

FIELD OF THE INVENTION

The present application relates to the field of display technology, particularly, to an array substrate, a display panel and a display device.

BACKGROUND OF THE INVENTION

The liquid crystal display has been widely used in field such as television, mobile phone and public information display owing to its advantages of small volume, light weight, low power consumption, low driving voltage and radiation free, which is the most widely used display technology currently. For the liquid crystal display, particularly with respect to application like large-size liquid crystal televisions, the liquid crystal display is required to have a broad visual angle range.

In the conventional liquid crystal display, the perpendicular electric field between the pixel electrode and the common electrode is mainly used to drive deflection of liquid crystal molecules. In such a case, if it is viewed at a relatively large angle deviating from the direction perpendicular to the plane of the display, the problems of low contrast and color distortion may exist, i.e., the problem of narrow visual angle (hereinafter referred to as "the visual angle") exists.

Therefore, it is proposed in the prior art various display modes to overcome the defect that the visual angle is too narrow. The various display modes include: 90° twisted nematic liquid crystal with compensation film mode, pixel electrode pattern vertical arrangement mode and plane driving mode using fringe field, etc.

Although the above display modes have been proposed successively and have been industrialized gradually, the above various display modes still have defects in actual use. The 90° twisted nematic liquid crystal with compensation film mode is limited for improvement of the visual angle, which is only applied in laptop computers and desktop monitors generally; the pixel electrode pattern vertical arrangement mode has to fabricate the pixel electrode into a complex slit structure, which influences the light utilization efficiency; the plane driving mode using fringe field requires a high process control accuracy, has a difficult manufacturing process and affects the contrast.

To sum up, the various display modes in the prior art for overcoming the defect that the visual angle of the liquid crystal display is too narrow all have corresponding defects, which cannot increase the display visual angle of the liquid crystal display effectively.

SUMMARY OF THE INVENTION

The embodiments of this disclosure provides an array substrate, a display panel and a display device, different regions of the pixel units are charged and discharged through a charge-discharge element and a plurality of thin film transistors, thereby forming a first voltage region and a second voltage region whose voltages are different from each other, and increasing the display visual angle of the liquid crsytal display.

The array substrate provided by the embodiment of this disclosure comprises: a plurality of data lines and a plurality of gate lines, a plurality of pixel units defined by the plurality of data lines and the plurality of gate lines, each pixel unit comprising a first pixel electrode, a second pixel electrode, and at least three thin film transistors, gates of a first thin film transistor and a second thin film transistor in the at least three thin film transistors being both connected to a same gate line in the plurality of gate lines, sources of the first thin film transistor and the second thin film transistor being both connected to a same data line in the plurality of data lines, a drain of the first thin film transistor being connected to the first pixel electrode, a drain of the second thin film transistor being connected to the second pixel electrode, wherein, the pixel unit further comprises: a charge-discharge element, the charge-discharge element and a third thin film transistor in the at least three thin film transistors charging and discharging the pixel unit such that the pixel unit forms a first voltage region and a second voltage region with different voltages.

According to the above array substrate provided by the embodiment of this disclosure, by adding a charge-discharge element in the pixel unit of the array substrate, different regions of the pixel unit are charged and discharged using the charge-discharge element and a plurality of thin film transistors, thereby forming a first voltage region and a second voltage region whose voltages are different from each other, such that the liquid crystal molecules have a plurality of regions with different orientations, so as to realize broad visual angle display of the liquid crystal, thereby overcoming the defect that the liquid crystal display visual angle is too narrow in the prior art, and increasing the display visual angle of the liquid crystal display effectively, moreover, the fabricating process is compatible with the existing fabricating process, and the device cost is not increased.

In a possible implementing mode, in the above array substrate provided by the embodiment of this disclosure, the pixel unit may further comprise a first auxiliary electrode, the charge-discharge element is a capacitor, the at least three thin film transistors are three thin film transistors, a gate of the third thin film transistor is connected to the gate line to which the gates of the first and second thin film transistors are connected, a source of the third thin film transistor is connected to the first pixel electrode, a drain of the third thin film transistor is connected to a first terminal of the capacitor, a second terminal of the capacitor is connected to the first auxiliary electrode, and a storage capacitance is formed between the first auxiliary electrode and the second pixel electrode. In such a case, the first auxiliary electrode may be arranged in the same layer as the gate of the third thin film transistor.

In a possible implementing mode, in the above array substrate provided by the embodiment of this disclosure, the pixel unit may further comprise a second auxiliary electrode, the charge-discharge element is a diode, a gate of the third thin film transistor is connected to the gate line to which the gates of the first and second thin film transistors are connected, a source of the third thin film transistor is connected to the first pixel electrode, a drain of the third thin film transistor is connected to a first electrode of the diode, a second electrode of the diode is connected to the second auxiliary electrode, and a storage capacitance is formed between the second auxiliary electrode and the second pixel electrode. In such a case, the second auxiliary electrode may be arranged in the same layer as the gate of the third thin film transistor.

In a possible implementing mode, in the above array substrate provided by the embodiment of this disclosure, the pixel unit may further comprise a third auxiliary electrode, the charge-discharge element is a diode, a gate of the third thin film transistor is connected to the gate line to which the gates of the first and second thin film transistors are connected, a source of the third thin film transistor is connected to the first pixel electrode, a drain of the third thin film transistor is connected to a first electrode of the diode, a first capacitance is formed between a second electrode of the diode and the third auxiliary electrode, and a storage capacitance is formed between the third auxiliary electrode and the second pixel electrode. In such a case, the third auxiliary electrode may be arranged in the same layer as the gate of the third thin film transistor.

In a possible implementing mode, in the above array substrate provided by the embodiment of this disclosure, the diode is realized through a fourth thin film transistor, a gate of the fourth thin film transistor and a source of the fourth thin film transistor are electrically connected and together serve as the first electrode of the diode, a drain of the fourth thin film transistor serves as the second electrode of the diode.

The embodiment of this disclosure provides a display panel comprising an array substrate according to this disclosure.

In a possible implementing mode, in the above display panel provided by the embodiment of this disclosure, the display panel may be a liquid crystal display panel.

According to the above display panel provided by the embodiment of this disclosure, by adding a charge-discharge element in the pixel unit of the array substrate, different regions of the pixel unit are charged and discharged using the charge-discharge element and a plurality of thin film transistors, thereby forming a first voltage region and a second voltage region whose voltages are different from each other, such that the liquid crystal molecules have a plurality of regions with different orientations, so as to realize broad visual angle display of the liquid crystal, thereby overcoming the defect that the liquid crystal display visual angle is too narrow in the prior art, and increasing the display visual angle of the liquid crystal display effectively, moreover, the fabricating process is compatible with the existing fabricating process, and the device cost is not increased.

The embodiment of this disclosure provides a display device comprising a display panel according to this disclosure.

In a possible implementing mode, in the above display device provided by the embodiment of this disclosure, the display device may be a liquid crystal display device.

According to the above display device provided by the embodiment of this disclosure, by adding a charge-discharge element in the pixel unit of the array substrate in the display panel, different regions of the pixel unit are charged and discharged using the charge-discharge element and a plurality of thin film transistors, thereby forming a first voltage region and a second voltage region whose voltages are different from each other, such that the liquid crystal molecules have a plurality of regions with different orientations, so as to realize broad visual angle display of the liquid crystal, thereby overcoming the defect that the liquid crystal display visual angle is too narrow in the prior art, and increasing the display visual angle of the liquid crystal display effectively, moreover, the fabricating process is compatible with the existing fabricating process, and the device cost is not increased.

DETAILED DESCRIPTION OF THE INVENTION

Next, the specific implementing modes of the array substrate, the display panel and the display device provided by the embodiments of this disclosure will be explained in detail with reference to the drawings.

The thickness of the film layers and the sizes and the shapes of the areas in the drawings do not reflect the real proportions of the respective components of the array substrate, which only aims for illustration of the contents of this disclosure schematically.

An array substrate provided by the embodiment of this disclosure comprises: a plurality of data lines and a plurality of gate lines, a plurality of pixel units defined by the plurality of data lines and the plurality of gate lines, each pixel unit comprising a first pixel electrode, a second pixel electrode, and at least three thin film transistors, gates of a first thin film transistor and a second thin film transistor in the at least three thin film transistors being both connected to a same gate line in the plurality of gate lines, sources of the first thin film transistor and the second thin film transistor being both connected to a same data line in the plurality of data lines, a drain of the first thin film transistor being connected to the first pixel electrode, a drain of the second thin film transistor being connected to the second pixel electrode, wherein, the pixel unit further comprises: a charge-discharge element, and a third thin film transistor in the at least three thin film transistors charging and discharging the pixel unit such that the pixel unit forms a first voltage region and a second voltage region with different voltages.

The first voltage region and the second voltage region may be a high voltage region and a low voltage region whose voltages are different from each other. When the first voltage region is a high voltage region, the second voltage region is a low voltage region; or when the first voltage region is a low voltage region, the second voltage region is a high voltage region.

According to the array substrate provided by the embodiment of this disclosure, by adding a charge-discharge element in the pixel unit of the array substrate, different regions of the pixel unit are charged and discharged using the charge-discharge element and a plurality of thin film transistors, thereby forming a first voltage region and a second voltage region whose voltages are different from each other, such that the liquid crystal molecules have a plurality of regions with different orientations, so as to realize broad visual angle display of the liquid crystal, thereby overcoming the defect that the liquid crystal display visual angle is too narrow in the prior art, and increasing the display visual angle of the liquid crystal display effectively, moreover, the fabricating process is compatible with the existing fabricating process, and the device cost is not increased.

In different specific implementing modes, the charge-discharge element in the pixel unit may be a capacitor, and may also be a diode or combination of the two. Next the structure of the array substrate of this disclosure will be explained in combination with the specific embodiments.

Embodiment I

Figure 1:
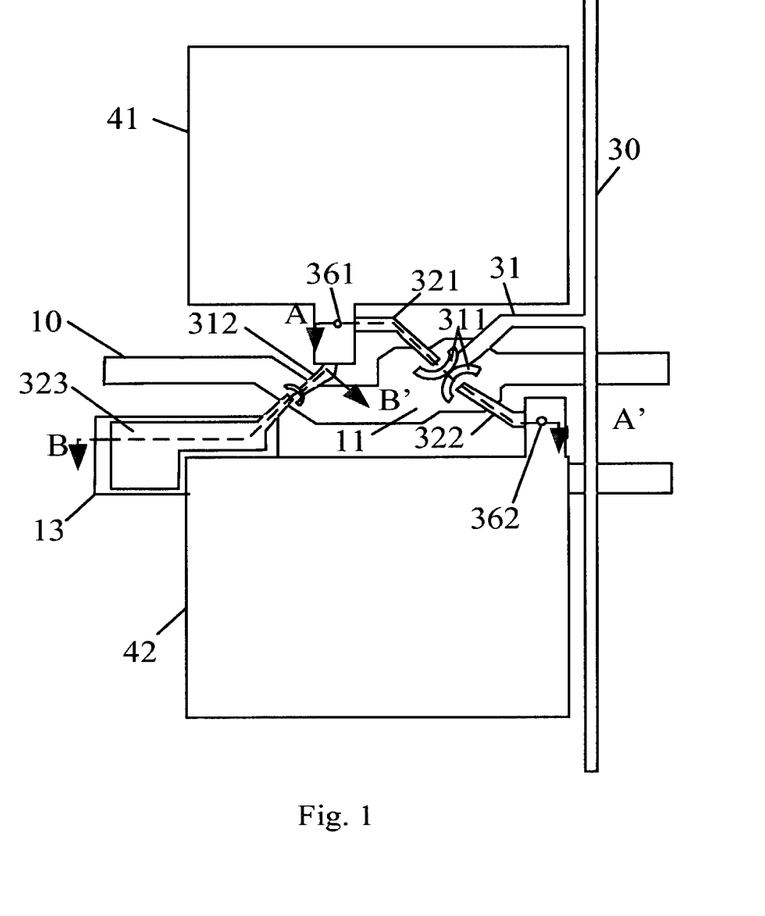
FIG. 1 is a structural schematic view of an array substrate provided by an embodiment of this disclosure.
Figure 2:
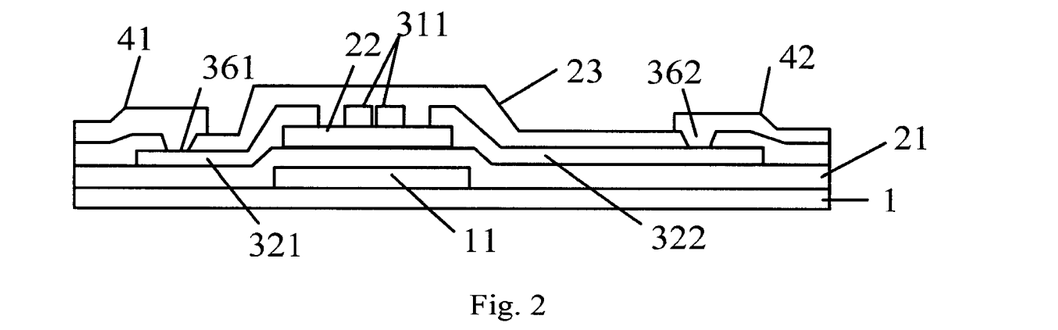
FIG. 2 is a section schematic view of the structure of array substrate as shown in FIG. 1 along A-A' line.
Figure 3:
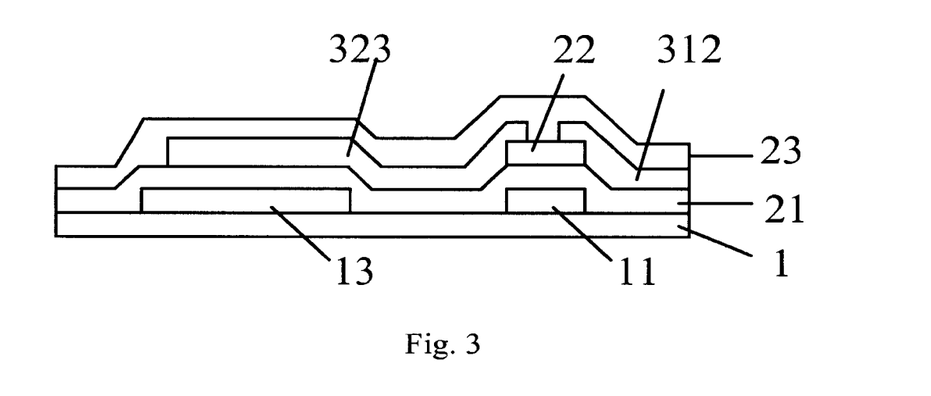
FIG. 3 is a section schematic view of the structure of array substrate as shown in FIG. 1 along B-B' line.

FIG. 1 is a structural schematic view of an array substrate provided by embodiment I of this disclosure, FIG. 2 is a section schematic view of the structure of the array substrate as shown in FIG. 1 along A-A' line, and FIG. 3 is a section schematic view of the structure of the array substrate as shown in FIG. 1 along B-B' line.

Referring to FIG. 1 to FIG. 3, the pixel unit comprises a first pixel electrode 41 and a second pixel electrode 42. A gate line 10 is located between the first pixel electrode 41 and the second pixel electrode 42. In addition, as shown in FIG. 1, the pixel unit may comprise a first thin film transistor to a third thin film transistor. A connecting portion 31 of a data line 30 can be connected to sources 311 of the first thin film transistor and the second thin film transistor. In addition, the gate line 10 between the first pixel electrode 41 and the second pixel electrode 42 can serve as a common gate 11 of respective thin film transistors. A drain 321 of the first thin film transistor may be electrically connected with the first pixel electrode 41 through a first via hole 361 that penetrates a passivation layer 23. A drain 322 of the second thin film transistor may be electrically connected with the second pixel electrode 42 through a second via hole 362 that penetrates the passivation layer 23.

The connection relationship of the first to the third thin film transistors is specifically: the gate 11 of the first thin film transistor is connected to the gate line 10, the source 311 is connected to the data line 30, the drain 321 is electrically connected with the first pixel electrode 41 through the first via hole 361; the gate 11 of the second thin film transistor is connected to the gate line 10, the source 311 is connected to the data line 30, the drain 322 is electrically connected with the second pixel electrode 42 through the second via hole 362; the gate 11 of the third thin film transistor is connected to the gate line 10, the source 312 is connected to the drain 321 of the first thin film transistor, the drain 323 is arranged between the passivation layer 23 and a gate insulating layer 21.

In addition, the pixel unit may further comprise a first auxiliary electrode 13 arranged between the gate insulating layer 21 and a substrate 1, thereby the capacitor constituted by the first auxiliary electrode 13 and the drain 323 of the third thin film transistor can serve as the charge-discharge element of the pixel unit.

Next, the fabricating process of the array substrate according to Embodiment I will be explained in detail with reference to FIG. 1 to FIG. 3. The steps of fabricating the array substrate according to Embodiment I comprise:

Step I, sputtering and depositing a metal layer on the substrate 1 of the array substrate, the metal layer is for example aluminum (Al), and patterning the deposited metal layer to form the gate line 10 comprising the gate 11 and the first auxiliary electrode 13;

Step II, depositing a gate insulating layer 21 using the plasma enhanced chemical vapor deposition (PEVCD) method, the material used for example is silicon nitride;

Step III, depositing a semiconductor layer, for example, depositing amorphous silicon (a-Si) using PECVD or sputtering and depositing indium gallium zinc oxide (IGZO), and patterning the deposited semiconductor layer to form an active layer 22;

Step IV, sputtering and depositing a metal layer, the metal layer is for example aluminum (Al), and patterning the deposited metal layer to form a data line 30 comprising a connecting portion 31, sources 311 of the first thin film transistor and the second thin film transistor, source 312 of the third thin film transistor, drain 321 of the first thin film transistor, the drain 322 of the second thin film transistor and drain 323 of the third thin film transistor, forming the drain 323 of the third thin film transistor into a terminal of the capacitor that serves as the charge-discharge element, and the first auxiliary electrode 13 being the other terminal of the capacitor;

Step V, depositing the passivation layer 23, for example, depositing the silicon nitride using PECVD or coating a resin layer, and forming a first via hole 361 and a second via hole 362 in the passivation layer 23 so as to expose the drain 321 of the first thin film transistor and the drain 322 of the second thin film transistor respectively; and Step VI, sputtering a transparent metal oxide conductive material layer, for example, indium tin oxides (ITO), and patterning the transparent metal oxide conductive material layer to form a first pixel electrode 41 and a second pixel electrode 42, the first pixel electrode 41 being electrically connected with the drain 321 of the first thin film transistor through the first via hole 361, the second pixel electrode 42 being electrically connected with the drain 322 of the second thin film transistor through the second via hole 362, and a storage capacitance being formed between the first auxiliary electrode 13 and the second pixel electrode 42.

According to respective embodiments of this disclosure, metal materials such as copper (Cu), aluminum (Al), molybdemum (Mo), titanium (Ti), chromium (Cr), tungsten (W) can be used for fabricating the gate lines and the data lines, alloys of these materials can also be used for fabricating the gate lines and the data lines. In addition, the gate line may be a single layer structure, and may also be a multi-layer structure, for example, Mo\Al\Mo, Ti\Cu\Ti, Mo\Ti\Cu.

According to the respective embodiments of this disclosure, silicon nitride or silicon oxide can be used for fabricating the gate insulating layer 21. In addition, the gate insulating layer 21 may be a single layer structure and may also be a multi-layer structure, for example, silicon oxide\silicon nitride.

According to the respective embodiments of this disclosure, the active layer 22 may use amorphous silicon or oxide semiconductor; the passivation layer 23 may use inorganics (e.g. silicon nitride), and may also use organics (e.g., resin); the first pixel electrode 41 and the second pixel electrode 42 are fabricated using transparent conductive indium zinc oxide (IZO), ITO or other transparent metal oxide conductive materials.

According to the Embodiment I of this disclosure, one terminal of the capacitor that serves as the charge-discharge element is the drain 323 of the third thin film transistor, the other terminal is the first auxiliary electrode 13. The capacitor can play the function of dividing voltage for a region (e.g. the low voltage region) of the pixel unit. When this region is charged (i.e., the gate line voltage is of a high level), the capacitor has to be charged additionally, thereby reducing the voltage of this region. When the gate line voltage is of a low level, the third thin film transistor is turned off, so as not to influence the region voltage. Therefore, a high voltage region and a low voltage region whose voltages are different from each other are formed, such that the liquid crystal molecules have a plurality of regions with different orientations, so as to realize broad visual angle display of the liquid crystal, thereby overcoming the defect that the liquid crystal display visual angle is too narrow in the prior art, and increasing the display visual angle of the liquid crystal display effectively.

Embodiment IT

Figure 4:
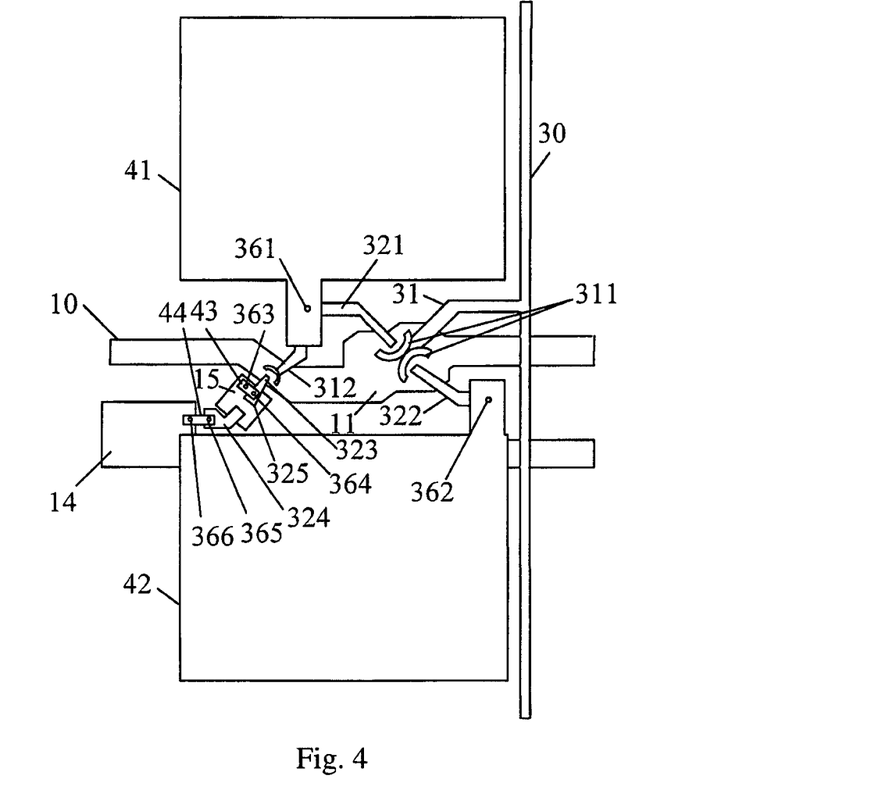
FIG. 4 to FIG. 6 are structural schematic views of array substrates provided by other embodiments of this disclosure.

FIG. 4 is a structural schematic view of another array substrate provided by Embodiment II of this disclosure.

Referring to FIG. 4, the pixel unit comprises a first pixel electrode 41 and a second pixel electrode 42. A gate line 10 is located between the first pixel electrode 41 and the second pixel electrode 42. In addition, as shown in FIG. 4, the pixel unit may comprise a first thin film transistor to a fourth thin film transistor. A connecting portion 31 of a data line 30 may be connected to sources 311 of the first thin film transistor and the second thin film transistor. In addition, the gate line 10 between the first pixel electrode 41 and the second pixel electrode 42 may serve as a common gate 11 of the first thin film transistor to the third thin film transistor. A drain 321 of the first thin film transistor may be electrically connected with the first pixel electrode 41 through a first via hole 361 that penetrates a passivation layer 23. A drain 322 of the second thin film transistor may be electrically connected to the second thin film transistor 42 through a second via hole 362 that penetrates the passivation layer 23.

The connection relationship of the first to the third thin film transistors is specifically: the gate 11 of the first thin film transistor is connected to the gate line 10, the source 311 is connected to the data line 30, the drain 321 is electrically connected with the first pixel electrode 41 through the first via hole 361; the gate 11 of the second thin film transistor is connected to the gate line 10, the source 311 is connected to the data line 30, the drain 322 is electrically connected with the second pixel electrode 42 through the second via hole 362; the gate 11 of the third thin film transistor is connected to the gate line 10, the source 312 is connected to the drain 321 of the first thin film transistor, the drain 323 is arranged between the passivation layer 23 and a gate insulating layer 21.

The pixel unit of the array substrate according to Embodiment II may further comprise a second auxiliary electrode 14 arranged between the gate insulating layer 21 and the substrate 1, and a diode that serves as the charge-discharge element is realized by a fourth thin film transistor. A storage capacitance can be formed between the second auxiliary electrode 14 and the second pixel electrode 42. In such a case, the second auxiliary electrode 14 may be arranged in the same layer as the gate 11 of the third thin film transistor.

The pixel unit may further comprise bridging layers 43 and 44 arranged on the passivation layer 23. The bridging layer 43 enables a gate 15 and a source 325 of the fourth thin film transistor to be connected with each other to serve as a first electrode of the diode, and a drain 324 of the fourth thin film transistor serves as a second electrode of the diode. The conduction of the diode in all the embodiments of the present invention is unidirectional conduction from the first electrode to the second electrode of the diode. The bridging layer 43 can be electrically connected with the gate 15 of the fourth thin film transistor through a third via hole 363, and can be electrically connected with the source 325 of the fourth thin film transistor through a fourth via hole 364, so as to enable the gate 15 and the source 325 of the fourth thin film transistor to be connected with each other.

In addition, the bridging layer 44 can be electrically connected with the drain 324 of the fourth thin film transistor through a fifth via hole 365, and can be electrically connected with the second auxiliary electrode 14 through a sixth via hole 366, so as to enable the drain 324 of the fourth thin film transistor to be connected with the second auxiliary electrode 14.

The gate 15 of the fourth thin film transistor can be formed simultaneously with the second auxiliary electrode 14 and the gate line 10, the active layer of the fourth thin film transistor can be formed simultaneously with the active layers of the first to the third thin film transistors, and the source 325 and the drain 324 of the fourth thin film transistor can be formed simultaneously with the sources and the drains of the first to the third thin film transistors, particularly, the source 325 of the fourth thin film transistor is connected with the drain 323 of the third thin film transistor. In addition, the bridging layers 43 and 44 can be formed simultaneously with the first pixel electrode 41 and the second pixel electrode 42 and using the same material.

Figure 5:
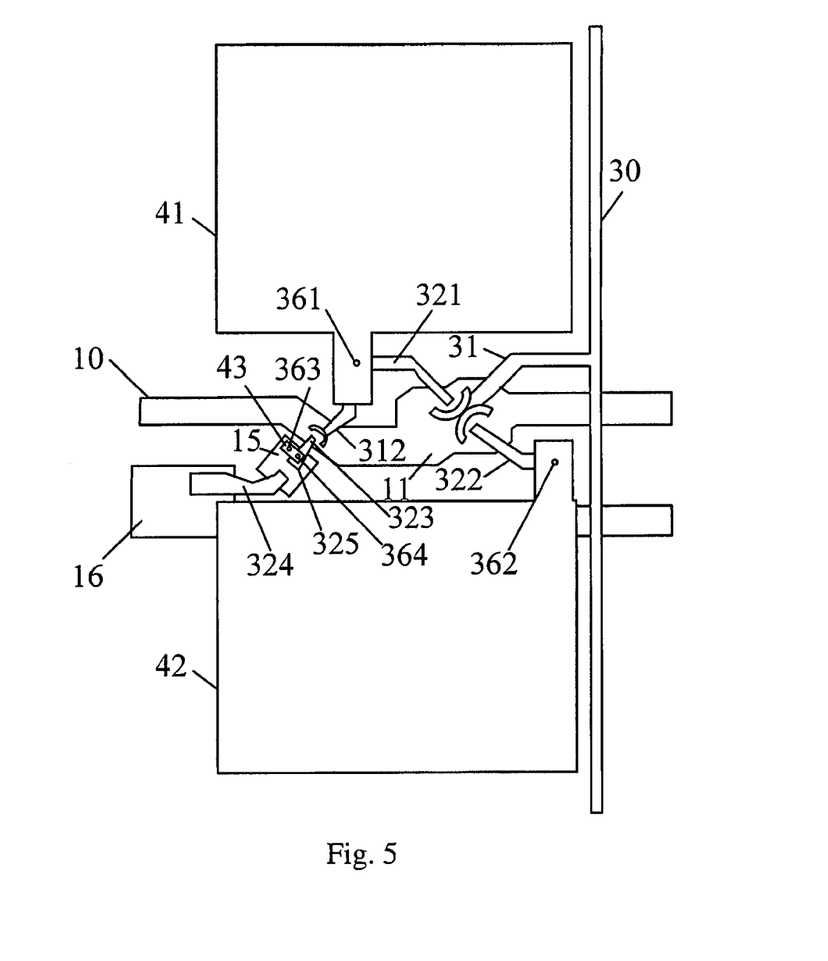

FIG. 5 shows a modified embodiment of the array substrate as shown in FIG. 4.

Referring to FIG. 5, the modified embodiment as shown in FIG. 5 does not comprise the bridging layer 44 that enables the drain 324 of the fourth thin film transistor to be connected with a third auxiliary electrode 16 (corresponding to the second auxiliary electrode 14 in FIG. 4). Thereby a first capacitance is formed between the drain 324 of the fourth thin film transistor and the third auxiliary electrode 16, meanwhile, a storage capacitance is formed between the third auxiliary electrode 16 and the second pixel electrode 42.

According to Embodiment II of this disclosure, the diode (which is realized through the fourth thin film transistor) that serves as the charge-discharge element and three thin film transistors (i.e., the first to the third thin film transistors) charge and discharge different regions of the pixel unit. For example, one region (e.g. a low voltage region) is charged and discharged using one thin film transistor, and this region is unidirectionally discharged using another thin film transistor and the diode, thereby forming a high voltage region and a low voltage region whose voltages are different from each other, such that the liquid crystal molecules have a plurality of regions with different orientations, so as to realize broad visual angle display of the liquid crystal, thereby overcoming the defect that the liquid crystal display visual angle is too narrow in the prior art, and increasing the display visual angle of the liquid crystal display effectively.

Embodiment III

Figure 6:
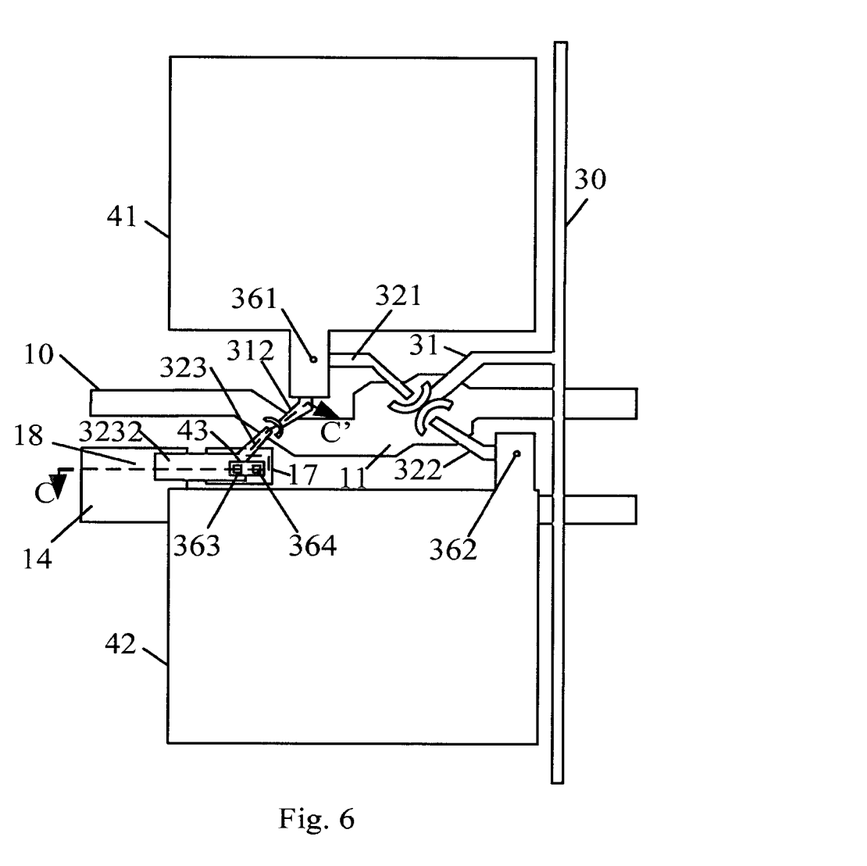
Figure 7:
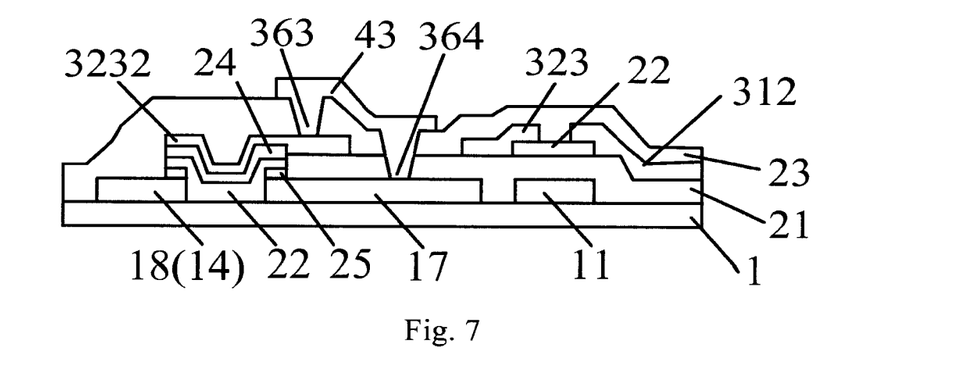
FIG. 7 is a section schematic view of the structure of array substrate as shown in FIG. 6 along C-C' line.

FIG. 6 is a structural schematic view of another array substrate provided by Embodiment III of this disclosure. FIG. 7 is a section schematic view of the structure of the array substrate as shown in FIG. 6 along C-C' line. Different from the embodiments as shown in FIG. 4 and FIG. 5 in which the fourth thin film transistor is a bottom gate structure, in the embodiments as shown in FIG. 6 and FIG. 7, the fourth thin film transistor is realized as a top gate type thin film transistor.

Referring to FIG. 6 and FIG. 7, the pixel unit comprises a first pixel electrode 41 and a second pixel electrode 42. A gate line 10 is located between the first pixel electrode 41 and the second pixel electrode 42. In addition, as shown in FIG. 6, the pixel unit may comprise a first thin film transistor to a fourth thin film transistor. The connection modes of the first thin film transistor to the third thin film transistor with the first pixel electrode, the second pixel electrode, the data lines, and the gate lines are same as Embodiment I and Embodiment II, which will not be repeated here.

As shown in FIG. 7, the pixel unit of the array substrate according to Embodiment III may further comprise a second auxiliary electrode 14 arranged between the gate insulating layer 21 and the substrate 1, and a diode that serves as the charge-discharge element is realized through a fourth thin film transistor. A storage capacitance can be formed between the second auxiliary electrode 14 and the second pixel electrode 42. In such a case, the second auxiliary electrode 14 can be arranged in the same layer as the gate 11 of the third thin film transistor.

The pixel unit may further comprise a bridging layer 43 arranged on the passivation layer 23. The bridging layer 43 enables a gate 3232 and a source 17 of the fourth thin film transistor to be connected with each other to serve as a first electrode of the diode, and a drain 18 (i.e., a part of the second auxiliary electrode 14) of the fourth thin film transistor serves as a second electrode of the diode. The drain 18 and the source 17 of the fourth thin film transistor may be arranged on the substrate 1 so as to be covered by the gate insulating layer 21. The bridging layer 43 can be electrically connected with the gate 3232 of the fourth thin film transistor through a third via hole 363 that penetrates the passivation layer 23, and can be electrically connected with the source 17 of the fourth thin film transistor through a fourth via hole 364 that penetrates the passivation layer 23 and the gate insulating layer 21, so as to enable the gate 3232 and the source 17 of the fourth thin film transistor to be connected with each other.

Step I, sputtering and depositing a metal layer on the substrate 1 of the array substrate, the metal layer is for example aluminum (Al), and patterning the deposited metal layer to form the gate line 10 comprising the gate 11, the drain 18 of the fourth thin film transistor (i.e., the second auxiliary electrode 14) and the source 17 of the fourth thin film transistor, in addition, forming N+ amorphous silicon (N+a-Si) layers 25 on the drain 18 and the source 17 simultaneously therewith through gray exposure process;

Step II, depositing a gate insulating layer 21 using PEVCD, the material used is for example silicon nitride;

Step III, depositing a semiconductor layer, for example, depositing amorphous silicon (a-Si) using PECVD or sputtering and depositing indium gallium zinc oxide (IGZO), and patterning the deposited semiconductor layer to form an active layer 22; then forming a gate insulating layer 24 on the active layer 22 of the fourth thin film transistor;

Step IV, sputtering and depositing a metal layer, the metal layer is for example aluminum (Al), and patterning the deposited metal layer to form a data line 30 comprising a connecting portion 31, sources 311 of the first thin film transistor and the second thin film transistor, source 312 of the third thin film transistor, drain 321 of the first thin film transistor, the drain 322 of the second thin film transistor, drain 323 of the third thin film transistor and gate 3232 of the fourth thin film transistor, particularly, the drain 323 of the third thin film transistor being connected with the gate 3232 of the fourth thin film transistor;

Step V, depositing a passivation layer 23, for example, depositing the silicon nitride using PECVD or coating a resin layer, and forming a first via hole 361 and a second via hole 362 in the passivation layer 23 so as to expose the drain 321 of the first thin film transistor and the drain 322 of the second thin film transistor respectively, forming a third via hole 363 that penetrates the passivation layer 23 to expose the gate 3232 of the fourth thin film transistor, and forming a fourth via hole 364 that penetrates the passivation layer 23 and the gate insulating layer 21 to expose the source 17 of the fourth thin film transistor; and Step VI, sputtering a transparent metal oxide conductive material layer, for example, indium tin oxides (ITO), and patterning the transparent metal oxide conductive material layer to form a first pixel electrode 41, a second pixel electrode 42 and a bridging layer 43, the first pixel electrode 41 being electrically connected with the drain 321 of the first thin film transistor through the first via hole 361, the second pixel electrode 42 being electrically connected with the drain 322 of the second thin film transistor through the second via hole 362, the bridging layer 43 being electrically connected with the gate 3232 and the source 17 of the fourth thin film transistor through the third via hole 363 and the fourth via hole 364 respectively, so as to enable the gate 3232 and the source 17 of the fourth thin film transistor to be connected with each other to serve as the first electrode of the diode, and the drain 18 of the fourth thin film transistor to serve as the second electrode of the diode.

According to Embodiment III of this disclosure, the diode (which is realized through the fourth thin film transistor of the top gate type) that serves as the charge-discharge element and three thin film transistors (i.e. the first to the third thin film transistors) charge and discharge different regions of the pixel unit. For example, one region (e.g. a low voltage region) is charged and discharged using one thin film transistor, and this region is discharged unidirectionally using another thin film transistor and the diode, thereby forming a high voltage region and a low voltage region whose voltages are different from each other, such that the liquid crystal molecules have a plurality of regions with different orientations, so as to realize broad visual angle display of the liquid crystal, thereby overcoming the defect that the liquid crystal display visual angle is too narrow in the prior art, and increasing the display visual angle of the liquid crystal display effectively.

The array substrate of respective embodiments of this disclosure can be applied in a display panel, particularly in a liquid crystal display panel. In the display panel, by adding a charge-discharge element in the pixel unit of the array substrate, different regions of the pixel unit are charged and discharged using the charge-discharge element and a plurality of thin film transistors, thereby forming a high voltage region and a low voltage region whose voltages are different from each other, such that the liquid crystal molecules have a plurality of regions with different orientations, so as to realize broad visual angle display of the liquid crystal, thereby overcoming the defect that the liquid crystal display visual angle is too narrow in the prior art, and increasing the display visual angle of the liquid crystal display effectively, moreover, the fabricating process is compatible with the existing fabricating process, and the device cost is not increased.

The display panel comprising the array substrate according to respective embodiments of this disclosure can be applied in a display device, particularly in a liquid crystal display device. In the display device, by adding a charge-discharge element in the pixel unit of the array substrate in the display panel, different regions of the pixel unit are charged and discharged using the charge-discharge element and a plurality of thin film transistors, thereby forming a first voltage region and a second voltage region whose voltages are different from each other, such that the liquid crystal molecules have a plurality of regions with different orientations, so as to realize broad visual angle display of the liquid crystal, thereby overcoming the defect that the liquid crystal display visual angle is too narrow in the prior art, and increasing the display visual angle of the liquid crystal display effectively, moreover, the fabricating process is compatible with the existing fabricating process, and the device cost is not increased.

The display device in which the array substrate according to respective embodiments of this disclosure can be applied may be any product or component with the display function such as electronic paper, an OLED panel, a mobile phone, a panel computer, a television, a display, a laptop, a digital photo frame, a navigator etc.

Apparently, the skilled person in the art can make various modifications and variations to this disclosure without departing from the spirit and scope of this disclosure. Thus, provided that these modifications and variations of this disclosure belong to the scopes of the claims of the present application and the equivalent technologies thereof, the present application also intends to cover these modifications and variations.

The invention claimed is:

1. An array substrate, comprising: a plurality of data lines and a plurality of gate lines, a plurality of pixel units defined by the plurality of data lines and the plurality of gate lines, each pixel unit comprising a first pixel electrode, a second pixel electrode, and at least three thin film transistors, gates of a first thin film transistor and a second thin film transistor in the at least three thin film transistors being both connected to a same gate line in the plurality of gate lines, sources of the first thin film transistor and the second thin film transistor being both connected to a same data line in the plurality of data lines, a drain of the first thin film transistor being connected to the first pixel electrode, a drain of the second thin film transistor being connected to the second pixel electrode, wherein,
the pixel unit further comprises: a charge-discharge element, the charge-discharge element and a third thin film transistor in the at least three thin film transistors charging and discharging the pixel unit such that the pixel unit forms a first voltage region and a second voltage region with different voltages, and wherein
the pixel unit further comprises a first auxiliary electrode, the charge-discharge element is a capacitor, the at least three thin film transistors are three thin film transistors, a gate of the third thin film transistor is connected to the gate line to which the gates of the first and second thin film transistors are connected, a source of the third thin film transistor is directly connected to the first pixel electrode, a drain of the third thin film transistor is connected to a first terminal of the capacitor, a second terminal of the capacitor is connected to the first auxiliary electrode, a projection of the drain of the third thin film transistor on the array substrate does not overlap with a projection of the second pixel electrode on the array substrate, a projection of the first auxiliary electrode on the array substrate does not overlap with a projection of the first pixel electrode on the array substrate, and a storage capacitance is formed between the first auxiliary electrode and the second pixel electrode.

2. The array substrate according to claim 1, wherein the first auxiliary electrode and the gate of the third thin film transistor are arranged in a same layer.

3. A display panel comprising an array substrate as claimed in claim 1.

4. The display panel according to claim 3, wherein the first auxiliary electrode and the gate of the third thin film transistor are arranged in a same layer.

5. The display panel according to claim 3, wherein the display panel is a liquid crystal display panel.

6. A display device comprising a display panel as claimed in claim 3.

7. The display device according to claim 6, wherein the first auxiliary electrode and the gate of the third thin film transistor are arranged in a same layer.

8. The display device according to claim 6, wherein the display device is a liquid crystal display device.

* * * * *